United States Patent
Huang

(10) Patent No.: US 12,250,519 B2
(45) Date of Patent: Mar. 11, 2025

(54) MEMS CAPACITANCE MICROPHONE AND MANUFACTURING METHOD THEREOF

(71) Applicant: Qsensing Microelectronics Co., Ltd, Shenzhen (CN)

(72) Inventor: Chien-Hsing Huang, Shenzhen (CN)

(73) Assignee: Qsensing Microelectronics Co., Ltd, Shenzhen (CN)

( * ) Notice: Subject to any disclaimer, the term of this patent is extended or adjusted under 35 U.S.C. 154(b) by 199 days.

(21) Appl. No.: 17/894,181

(22) Filed: Aug. 24, 2022

(65) Prior Publication Data

US 2023/0403514 A1    Dec. 14, 2023

(30) Foreign Application Priority Data

Jun. 8, 2022   (CN) .......................... 202210648175.8

(51) Int. Cl.
*H04R 19/04*   (2006.01)
*B81B 3/00*    (2006.01)
(Continued)

(52) U.S. Cl.
CPC ............. *H04R 19/04* (2013.01); *B81B 3/001* (2013.01); *B81C 1/00968* (2013.01); *H04R 7/04* (2013.01); *H04R 7/18* (2013.01); *H04R 31/003* (2013.01); *H04R 31/006* (2013.01); *B81B 2201/0257* (2013.01); *B81B 2203/0127* (2013.01); *B81B 2203/04* (2013.01); *B81C 2201/0109* (2013.01); *H04R 2201/003* (2013.01)

(58) Field of Classification Search
CPC . H04R 19/04; H04R 7/04; H04R 7/18; H04R 31/003; H04R 31/006; H04R 2201/003; H04R 1/04; H04R 19/005; B81B 3/001; B81B 2201/0257; B81B 2203/0127; B81B 2203/04; B81B 7/0048; B81B 7/02; B81B 2201/0264; B81C 1/00968; B81C 2201/0109; B81C 1/00158
See application file for complete search history.

(56) References Cited

U.S. PATENT DOCUMENTS

2007/0201709 A1*   8/2007   Suzuki ................. H04R 19/005
                                                 381/174
2015/0146906 A1*   5/2015   Je ............................ H04R 7/02
                                                 381/369

(Continued)

*Primary Examiner* — Carolyn R Edwards
*Assistant Examiner* — Julie X Dang

(57) ABSTRACT

A MEMS capacitance microphone includes a substrate, a diaphragm, a back plate structure and a plurality of support structures. The substrate is provided with a plurality of gate structures and a cavity penetrating through the substrate, and the gate structures extend from an inner wall of the cavity to the center of the cavity. The diaphragm is vibratably arranged on one side of the substrate and includes a main deformation zone and a non-main deformation zone. The back plate structure is arranged on the diaphragm, and the diaphragm is located between the substrate and the back plate structure. The support structures are arranged on the back plate structure, penetrate the periphery of the main deformation zone, and respectively abut against the gate structures. The MEMS capacitance microphone has higher rigidity of a back plate, and is capable of greatly reducing the impedance of air to increase its signal-to-noise ratio.

9 Claims, 7 Drawing Sheets

(51) Int. Cl.
 *B81C 1/00* (2006.01)
 *H04R 7/04* (2006.01)
 *H04R 7/18* (2006.01)
 *H04R 31/00* (2006.01)

(56) References Cited

U.S. PATENT DOCUMENTS

2020/0021920 A1* 1/2020 Sun ..................... B81B 3/001
2022/0396469 A1* 12/2022 Chen ..................... H04R 7/06

* cited by examiner

MEMS CAPACITANCE MICROPHONE AND MANUFACTURING METHOD THEREOF

FIELD OF THE INVENTION

The present invention relates to the technical field of microphones, and more particularly to a micro-electromechanical (MEMS) capacitance microphone and a manufacturing method thereof.

BACKGROUND OF THE INVENTION

MEMS microphones have increased requirements for wider dynamic range as well as high sensitivity, signal-to-noise ratio and structural reliability. In addition to have a trade-off between the sensitivity and the dynamic range, the MEMS capacitance microphones have a dilemmatic trade-off among low impedance of air (high opening ratio of back plates), high rigidity of back plates and large area of back-plate electrodes, which will significantly affect the signal-to-noise ratio of the MEMS capacitance microphones.

Specifically, in the MEMS capacitance microphones, in order to achieve high sensitivity of collecting tiny sounds, the flexibility of diaphragm needs to be increased, that is, they are more likely to be deformed by sound pressure, so the allowable sound pressure level will be reduced, resulting in a narrower dynamic range. When large volume is generated, output signals will be distorted more, resulting in cracking voice. On the contrary, if the rigidity of the diaphragm is increased, that is, they are less likely to be deformed by the sound pressure, they are not easy to nonlinearly deform under large volume, thereby greatly reducing the degree of distortion, increasing the allowable sound pressure level and widening the dynamic range of the microphones. But the sensitivity will be decreased, which directly affects the signal-to-noise ratio. In addition, in order to increase the signal-to-noise ratio of the MEMS capacitance microphones, how to reduce noise sources, such as Johnson-Nyquist noise in circuits, parasitic capacitance coupled by MEMS structures, air impedance or sound pressure deformation caused by insufficient back plate rigidity, must be considered.

Therefore, how to improve the structural design of MEMS microphones to solve the dilemma that traditional MEMS microphones have a high trade-off among the impedance of air, the area of back-plate electrodes and the rigidity of back plates is what current practitioners are striving for.

SUMMARY OF THE INVENTION

The present invention provides a MEMS capacitance microphone and a manufacturing method thereof. The MEMS capacitance microphone has higher rigidity of a back plate and is capable of greatly reducing the impedance of air to increase its signal-to-noise ratio. Meanwhile, the MEMS capacitance microphone also has the advantage of high sensing efficiency.

The MEMS capacitance microphone provided by the present invention includes a substrate, a diaphragm, a back plate structure and a plurality of support structures. The substrate is provided with a cavity and a plurality of gate structures, the cavity penetrates through the substrate, and the plurality of gate structures extend from an inner wall of the cavity to the center of the cavity. The diaphragm is vibratably arranged on one side of the substrate and includes a main deformation zone and a non-main deformation zone, and the non-main deformation zone surrounds the main deformation zone. The back plate structure is arranged on one side of the diaphragm, and the diaphragm is located between the substrate and the back plate structure. The plurality of support structures are arranged on the back plate structure, penetrate the periphery of the main deformation zone of the diaphragm, and respectively abut against the plurality of gate structures.

In an embodiment of the present invention, the back plate structure includes a back-plate main body and a back-plate electrode, the diaphragm is used as a vibrating electrode, the vibrating electrode faces the back-plate electrode, and an air gap exists between the vibrating electrode and the back-plate electrode.

In an embodiment of the present invention, the back plate structure further includes a plurality of anti-adhesion stoppers arranged on the back-plate electrode and protruding towards the vibrating electrode.

In an embodiment of the present invention, the back plate structure defines a first zone and a second zone, the first zone corresponds to the main deformation zone of the diaphragm, the second zone corresponds to the non-main deformation zone of the diaphragm, the first zone is formed with a plurality of first sound holes, the second zone is formed with a plurality of second sound holes, and the area of each of the plurality of second sound holes is larger than the area of each of the plurality of first sound holes.

In an embodiment of the present invention, an opening ratio of the plurality of second sound holes in the second zone is greater than 60%, and the shape of the plurality of second sound holes is selected from one or a combination of a circle, an ellipse or a polygon.

In an embodiment of the present invention, the MEMS capacitance microphone further includes a first insulating spacer layer and a second insulating spacer layer, wherein the first insulating spacer layer and the second insulating spacer layer are respectively provided with a first opening and a second opening, the first insulating spacer layer is arranged between the non-main deformation zone of the diaphragm and the substrate, the first opening connects with the cavity, the second insulating spacer layer is arranged between the non-main deformation zone of the diaphragm and the second zone of the back plate structure, and the second opening connects with the plurality of first sound holes and the plurality of second sound holes.

In an embodiment of the present invention, the plurality of gate structures are evenly distributed on the inner wall of the cavity in a centric shape.

In an embodiment of the present invention, the shape of the plurality of gate structures is selected from one or a combination of a strip, a circle, a ring, an ellipse, a honeycomb, a square, a triangle and a polygon.

In an embodiment of the present invention, the diaphragm is formed with a plurality of diaphragm through holes for the plurality of support structures to respectively pass through, wherein a gap exists between each of the plurality of support structures and an inner wall of each of the plurality of diaphragm through holes.

The manufacturing method of the MEMS capacitance microphone provided by the present invention includes the following steps: providing a substrate; forming a first sacrificial layer on the substrate; forming a diaphragm on the first sacrificial layer, the diaphragm including a main deformation zone and a non-main deformation zone surrounding the main deformation zone, the periphery of the main deformation zone of the diaphragm being formed with a plurality of diaphragm through holes; forming a second sacrificial layer on the first sacrificial layer, covering the diaphragm and filling the plurality of diaphragm through holes; forming a third sacrificial layer on the second sacrificial layer, and forming a plurality of anti-adhesion stopper grooves in the third sacrificial layer; forming a back-plate electrode on the third sacrificial layer, the back-plate electrode being formed with a plurality of anti-adhesion-stopper through holes, the plurality of anti-adhesion-stopper through holes respectively corresponding to the plurality of anti-adhesion stopper grooves; forming a plurality of support-structure through grooves, each of the plurality of support-structure through grooves penetrating through the back-plate electrode, the third sacrificial layer, the second sacrificial layer in the diaphragm through holes, and the first sacrificial layer, wherein a part of the second sacrificial layer is remained on inner walls of the plurality of diaphragm through holes; forming a back-plate main body, a plurality of support structures and a plurality of anti-adhesion stoppers, wherein the back-plate main body is arranged on the back-plate electrode, the back-plate main body and the back-plate electrode form a back plate structure, the plurality of support structures are respectively formed in the plurality of support-structure through grooves, and each of the plurality of anti-adhesion stoppers is formed in each of the plurality of anti-adhesion-stopper through holes and each of the plurality of anti-adhesion stopper grooves; forming a plurality of first sound holes and a plurality of second sound holes on the back plate structure, wherein the positions of the first sound holes correspond to the main deformation zone of the diaphragm, the positions of the second sound holes correspond to the non-main deformation zone of the diaphragm, and the area of each second sound holes is larger than the area of each first sound holes; forming a cavity and a plurality of gate structures on the substrate, the cavity penetrating through the substrate, the plurality of gate structures extending from an inner wall of the cavity to the center of the cavity, the plurality of gate structures respectively corresponding to the plurality of support structures; and removing a part of the first sacrificial layer, a part of the second sacrificial layer and a part of the third sacrificial layer, wherein the first sacrificial layer is formed with a first opening to connect with the cavity, and the second sacrificial layer and the third sacrificial layer are formed with a second opening to connect with the first sound holes and the second sound holes.

In an embodiment of the present invention, when a part of the second sacrificial layer is removed, a part of the second sacrificial layer remained in the inner walls of the plurality of diaphragm through holes is removed, so that a gap exists between each of the plurality of support structures and the inner wall of each of the plurality of diaphragm through holes.

In an embodiment of the present invention, before the cavity and the plurality of gate structures are formed on the substrate, a polishing process is performed on a back surface, away from the first sacrificial layer, of the substrate to thin the substrate.

In an embodiment of the present invention, the first sacrificial layer is silicon oxide, silicon nitride or a combination thereof.

In an embodiment of the present invention, a material of the diaphragm is a superposition of a polycrystalline silicon layer, a metal layer, an insulating layer and a polycrystalline silicon layer, or a superposition of an insulating layer and a metal layer.

In an embodiment of the present invention, the step of forming the back-plate main body, the plurality of support structures and the plurality of anti-adhesion stoppers includes the following steps: depositing a non-conductive material on the third sacrificial layer, the non-conductive material covering the back-plate electrode and filling the plurality of anti-adhesion-stopper through holes, the plurality of anti-adhesion stopper grooves and the plurality of support-structure through grooves.

According to the present invention, due to the arrangement of the gate structures, support structures can be provided between the back plate structure and the gate structures to support an inner side zone of the back plate structure, prevent excessive deformation and provide the back plate structure with higher rigidity. Because the inner side zone of the back plate structure is supported, a large area of acoustic holes (i.e., a larger area of second sound holes) can be formed in the periphery of the supported position to greatly reduce the impedance of air so as to increase the signal-to-noise ratio of the MEMS capacitance microphone. In a structure of the MEMS capacitance microphone according to the embodiment of the present invention, the diaphragm can be divided into the main deformation zone and the non-main deformation zone according to the degree of change of its deformation curve, and the back plate structure can also be divided into the main electrode zone and the non-main electrode zone. The back-plate electrode is mainly arranged in the main electrode zone corresponding to the main deformation zone, so that the best capacitance change ratio can be obtained according to the deformation zone of the diaphragm for the sensitivity of the MEMS capacitance microphone, and the sensing efficiency of the MEMS capacitance microphone can be improved.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
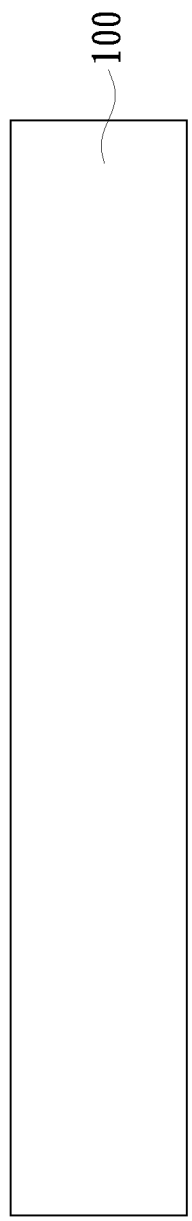
FIG. 1A to FIG. 1J are schematic cross-sectional views of a manufacturing method of a MEMS capacitance microphone according to an embodiment of the present invention.

FIG. 1A to FIG. 1J are schematic cross-sectional views of a manufacturing method of a MEMS capacitance microphone according to an embodiment of the present invention. As shown in FIG. 1A, a substrate 100 is provided. Specifically, the substrate 100 is configured to provide a process platform for the formation of a MEMS capacitance microphone. The substrate 100 may be a silicon substrate, a germanium substrate, a silicon germanium substrate, a silicon carbide substrate, a silicon-on-insulator substrate, a germanium-on-insulator substrate, a glass substrate, a III-V compound substrate (e.g., a gallium nitride substrate or a gallium arsenide-based substrate) or other suitable substrates. In this embodiment, the substrate 100 is the silicon substrate as an example, but is not limited thereto.

Figure 1B:
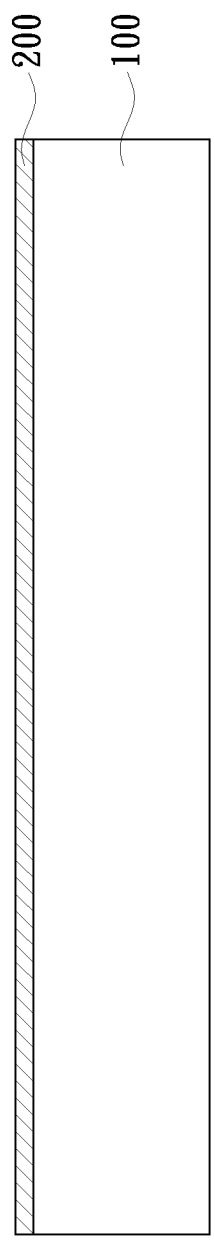

Next, as shown in FIG. 1B, a first sacrificial layer 200 is formed on the substrate 100. Specifically, the first sacrificial layer 200 is formed on the substrate 100 by chemical vapor deposition or other suitable methods. The first sacrificial layer 200 is preferably made of silicon dioxide to be insulated from a subsequently formed diaphragm 300 (shown in FIG. 1C), and has a higher etching selectivity ratio during the structural release to avoid the damage to the diaphragm 300 by a chemical solution upon the structural release. However, the selection of a material of the first sacrificial layer is not limited thereto. The material may also include, for example, a superposition of silicon nitride, silicon oxide and silicon nitride, or other suitable materials, and can be specifically selected according to needs, which is not limited here.

Figure 1C:
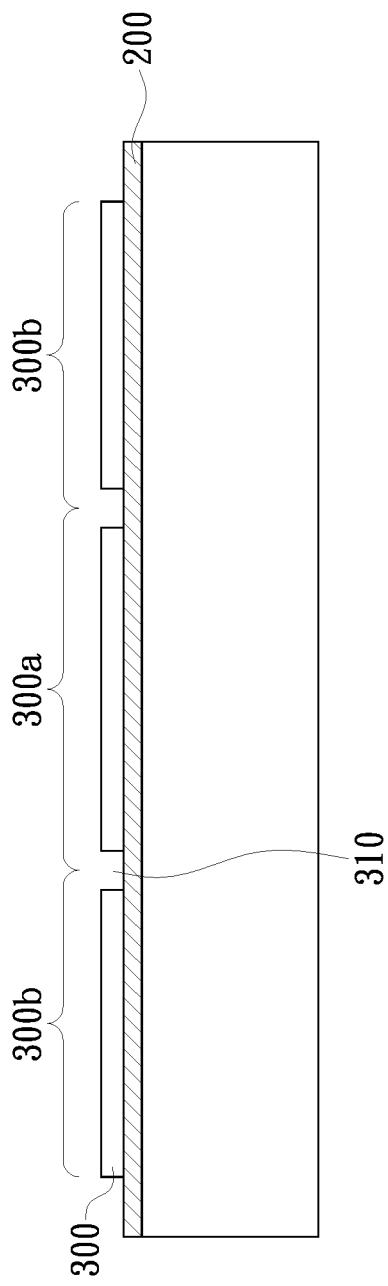

Next, as shown in FIG. 1C, a diaphragm 300 is formed on the first sacrificial layer 200. Specifically, a material layer of the diaphragm is formed by physical vapor deposition or other suitable methods, and then patterned by photolithography, etching and other processes to obtain the diaphragm 300. The diaphragm 300 serves as a vibrating electrode of the MEMS capacitance microphone, and a material of the diaphragm 300 may include a superposition of a polycrystalline silicon layer, a metal layer, an insulating layer and a polycrystalline silicon layer, a superposition of an insulating layer and a metal layer, or other elastic metals. In an embodiment, the diaphragm 300 includes a main deformation zone 300*a* and a non-main deformation zone 300*b*, and the non-main deformation zone 300*b* surrounds the main deformation zone 300*a*, wherein the periphery of the main deformation zone 300*a* of the diaphragm 300 is formed with a plurality of diaphragm through holes 310.

Figure 1D:
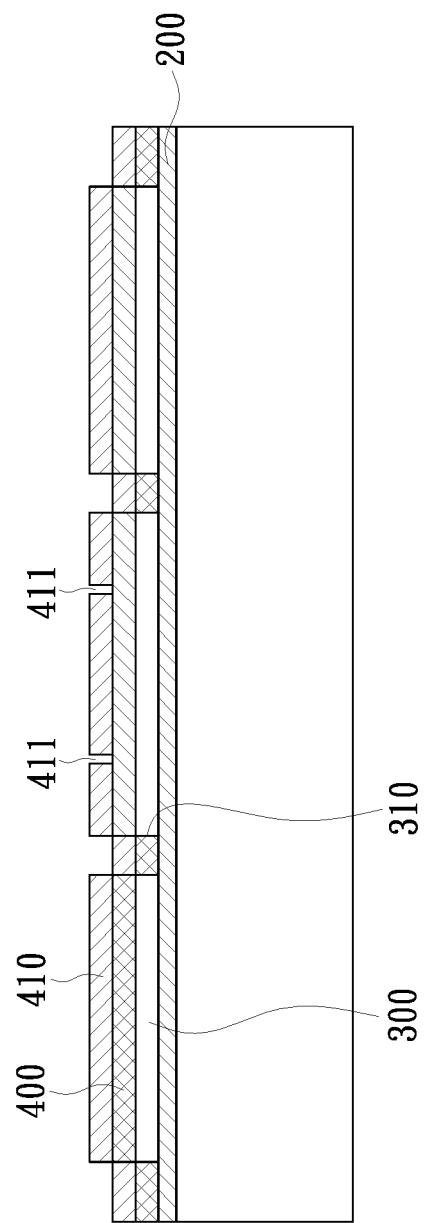

Next, as shown in FIG. 1D, a second sacrificial layer 400 is formed on the first sacrificial layer 200, covers the diaphragm 300 and fills a plurality of diaphragm through holes 310; and after that, a third sacrificial layer 410 is formed on the second sacrificial layer 400, and the third sacrificial layer 410 is formed with a plurality of anti-adhesion stopper grooves 411. Specifically, in an embodiment, the second sacrificial layer 400 and the third sacrificial layer 410 are stacked on the first sacrificial layer 200 layer by layer and cover the diaphragm 300, wherein the second sacrificial layer 400 and the third sacrificial layer 410 are formed by chemical vapor deposition, physical vapor deposition or other suitable methods, a material of the second sacrificial layer 400 and the third sacrificial layer 410 may include silicon dioxide or other suitable materials, and the material of the second sacrificial layer 400 and/or the third sacrificial layer 410 may be the same as or different from the material of the first sacrificial layer 200, which is not limited here. However, as a preference, the material of the second sacrificial layer 400 or the third sacrificial layer 410 and the material of the diaphragm 300 have a higher etching selectivity ratio to avoid the damage to the diaphragm 300 during the subsequent etching. In another embodiment, anti-adhesion stopper grooves 411 are formed in the third sacrificial layer 410 by photolithography, etching and other processes. Alternatively, a fourth sacrificial layer and the like may be further formed on the third sacrificial layer 410 according to space requirements of an air gap described later.

Figure 1E:
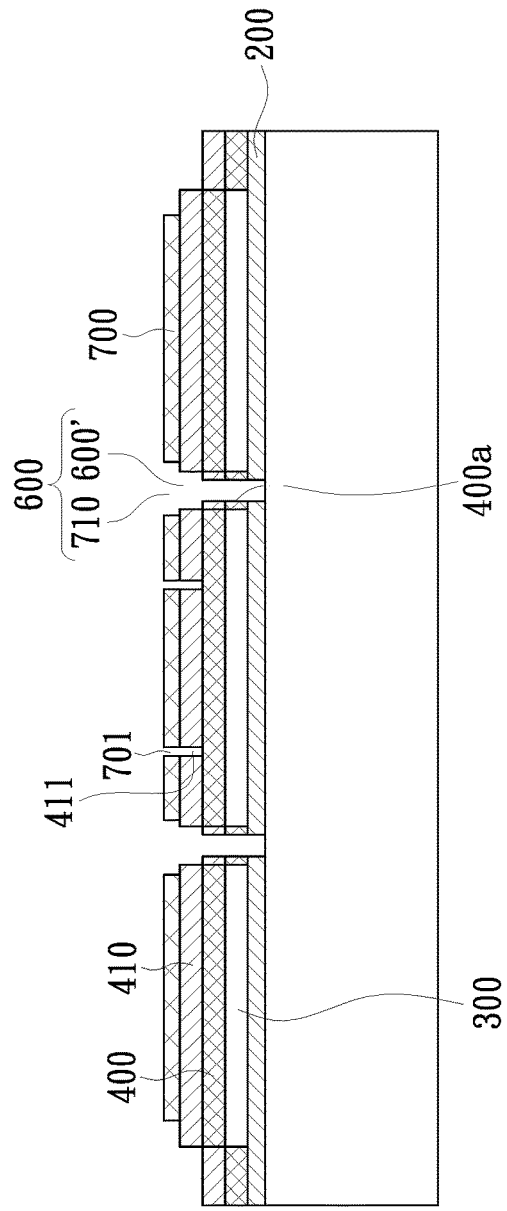

Next, as shown in FIG. 1E, a back-plate electrode 700 is formed on the third sacrificial layer 410, a plurality of support-structure through grooves 600 are formed, and each of the support-structure through grooves 600 penetrates through the back-plate electrode 700, the third sacrificial layer 410, a part of the second sacrificial layer 400 in the diaphragm through holes 310 (marked in FIG. 1C and FIG. 1D), and the first sacrificial layer 200, wherein the support-structure through grooves 600 penetrate through a part of the second sacrificial layer 400 in the diaphragm through holes 310, so that a part of the second sacrificial layer 400 is remained on inner walls of the diaphragm through holes 310. In addition, the back-plate electrode 700 is formed with a plurality of anti-adhesion-stopper through holes 701, and the plurality of anti-adhesion-stopper through holes 701 respectively correspond to a plurality of anti-adhesion stopper grooves 411. Specifically, in an embodiment, after the back-plate electrode 700 is formed on the third sacrificial layer 410, the plurality of support-structure through grooves 600 directly penetrating through the back-plate electrode 700, the third sacrificial layer 410, a part of the second sacrificial layer 400 in the diaphragm through holes 310, and the first sacrificial layer 200 are formed, which is not limited thereto. In another embodiment, as shown in FIG. 1E, after the third sacrificial layer 410 is formed, a part of support-structure through grooves 600' are first defined to be formed to penetrate through the third sacrificial layer 410, a part of the second sacrificial layer 400 in the diaphragm through holes 310, and the first sacrificial layer 200, and after the back-plate electrode 700 is formed, a back-plate-electrode through hole 710 is defined to be formed to penetrate through the back-plate electrode 700; and the support-structure through grooves 600' connects with the back-plate-electrode through hole 710 to form the support-structure through grooves 600. In another embodiment, after the respective sacrificial layer (e.g., the first sacrificial layer 200, the second sacrificial layer 400 or the third sacrificial layer 410) is deposited, local support-structure through grooves 600 can be independently defined to make a process for forming the support-structure through grooves 600 highly flexible.

For the formation of the back-plate electrode 700, e.g., a back-plate conductive layer (not shown) is first formed on the third sacrificial layer 410 and then patterned to form the back-plate electrode 700. Specifically, a conductive material is deposited by physical vapor deposition or other suitable methods to form the back-plate conductive layer of which a material may include polycrystalline silicon or other suitable materials, and then a part of zones of the corresponding support-structure through grooves 600' of the back-plate conductive layer are removed by photolithography, etching and other processes to form the above back-plate-electrode through hole 710 and the back-plate electrode 700. In an embodiment, a coverage zone of the back-plate electrode 700 on the third sacrificial layer 410 corresponds to a sensing zone of the MEMS capacitance microphone, so as to form a capacitive structure together with the diaphragm 300 as the vibrating electrode, that is, an effective capacitance zone of the MEMS capacitance microphone.

The support-structure through grooves 600 may be in columnar, hollow annular, annular or discontinuous annular distribution. In an embodiment, longitudinal sections of the support-structure through grooves 600 may be stepped or linear, and single cross sections of the support-structure through grooves 600 may be circular, hollow annular, oval, honeycombed, egg-shaped, square, triangular, polygonal or in any other shape.

Figure 1F:
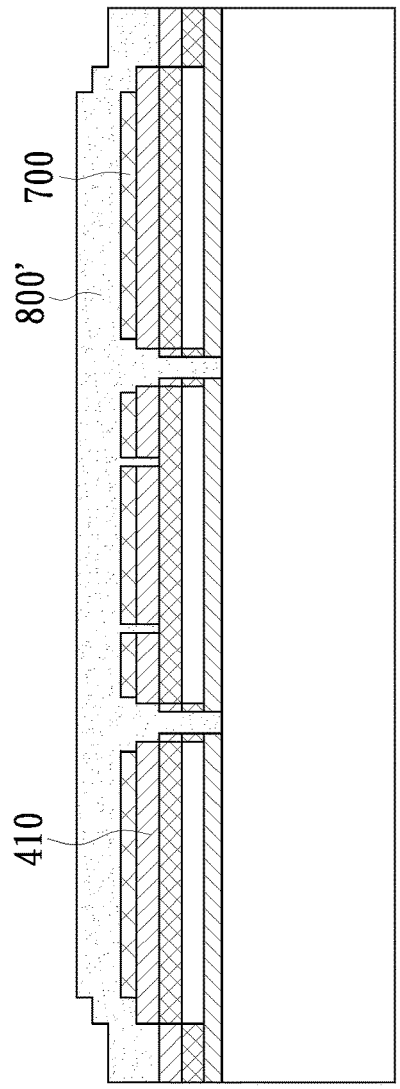

Next, a back-plate main body 800 (marked in FIG. 1G described later), a plurality of support structures 840 (marked in FIG. 1G described later) and a plurality of anti-adhesion stoppers 850 (marked in FIG. 1G described later) are formed. In an embodiment, the back-plate main body 800, the support structures 840 and the anti-adhesion stoppers 850 are manufactured as shown in FIG. 1F. A non-conductive material 800' is deposited on the third sacrificial layer 410, and the non-conductive material 800' covers the back-plate electrode 700 and fills the anti-adhesion-stopper through holes 701 (marked in FIG. 1E), the anti-adhesion stopper grooves 411 (marked in FIG. 1E) and the support-structure through grooves 600 (marked in FIG. 1E). Specifically, the non-conductive material 800' is deposited by chemical vapor deposition, physical vapor deposition or other suitable methods, covers a top surface and a side surface of the third sacrificial layer 410, and fills the support-structure through grooves 600, the anti-adhesion-stopper through holes 701 and the anti-adhesion stopper grooves 411, and the non-conductive material 800' may be, for example, an insulating material or other suitable materials.

Figure 1G:
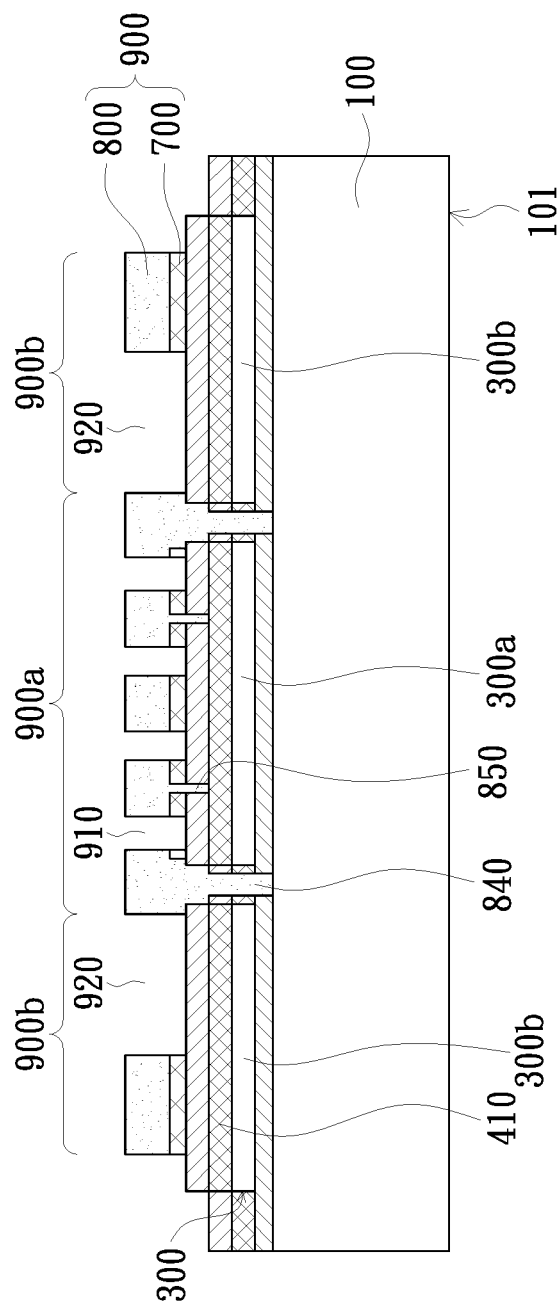

After that, a part of the non-conductive material 800' located on the side surface of the third sacrificial layer 410 is removed, as shown in FIG. 1G, to form the back-plate main body 800, the plurality of support structures 840 and the plurality of anti-adhesion stoppers 850, and the support structures 840 and the anti-adhesion stoppers 850 are connected to the back-plate main body 800. The back-plate main body 800 is arranged on the back-plate electrode 700, the back-plate main body 800 and the back-plate electrode 700 form a back plate structure 900, the plurality of support structures 840 are respectively formed in the plurality of support-structure through grooves 600 (marked in FIG. 1E), and each of the plurality of anti-adhesion stoppers 850 is formed in each of the plurality of anti-adhesion-stopper through holes 701 (marked in FIG. 1E) and each of the plurality of anti-adhesion stopper grooves 411 (marked in FIG. 1E). In an embodiment, a zone of the back-plate main body 800 may be larger than a zone of the back-plate electrode 700, that is, the back-plate electrode 700 does not necessarily exist in a part of the zone of the back-plate main body 800.

The support structures 840 connect the back-plate main body 800 and the substrate 100. In an embodiment, the support structures 840 may be formed at a time by filling the support-structure through grooves 600 with the non-conductive material 800', which is not limited thereto. In an unshown embodiment, the support structures 840 may also be formed in stages corresponding to the independent definition and formation of support-structure through grooves 600b in each sacrificial layer.

Figure 2:
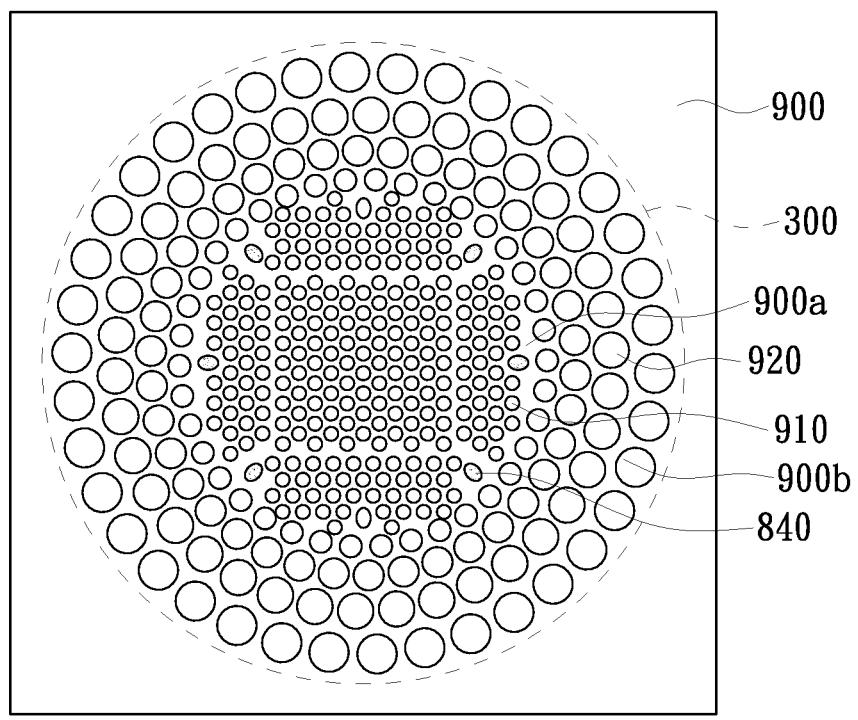
FIG. 2 is a schematic top view of a back plate structure according to an embodiment of the present invention.

FIG. 2 is a schematic top view of a back plate structure according to an embodiment of the present invention. Referring to FIG. 1G and FIG. 2 at the same time, the back plate structure 900 is defined to include a first zone and a second zone, wherein the first zone is a main electrode zone 900a, the second zone is a non-main electrode zone 900b, the main electrode zone 900a, for example, corresponds to the main deformation zone 300a of the diaphragm 300, and the non-main electrode zone 900b, for example, corresponds to the non-main deformation zone 300b of the diaphragm 300. A plurality of first sound holes 910 are formed in the main electrode zone 900a, and a plurality of second sound holes 920 are formed in the non-main electrode zone 900b, that is, distribution positions of the first sound holes 910 correspond to the main deformation zone 300a of the diaphragm 300, and distribution positions of the second sound holes 920 correspond to the non-main deformation zone 300b of the diaphragm 300, wherein the area of each of the second sound holes 920 is larger than the area of each of the first sound holes 910. In an embodiment, the shape of the second sound holes 920 may be a combination of a circle, a fan shape, an ellipse, a polygon or any shape, but is not limited thereto. Furthermore, the opening area of the second sound holes 920 accounts for 60% or above of the area of the non-main electrode zone 900b. As shown in FIG. 2, the support structures 840 are, for example, evenly distributed on the periphery of the main electrode zone 900a.

Figure 1H:
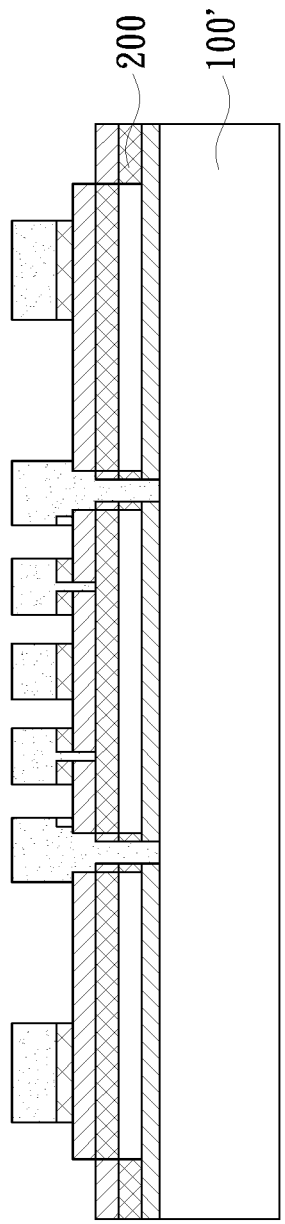
Figure 1I:
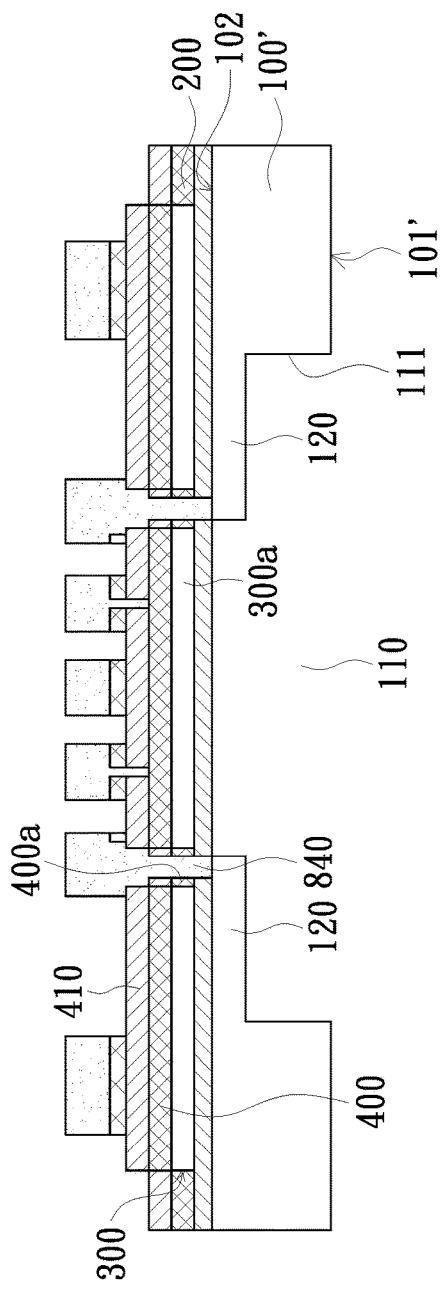

After that, a main electrical structure of the MEMS capacitance microphone is manufactured, for example, a conductive layer of a conductive contact window is defined by a common process, which will not be described again here. Next, as shown in FIG. 1H, a polishing process is performed on a back surface 101, away from the first sacrificial layer 200, of the substrate 100 to obtain a thinned substrate 100'. In an embodiment, the substrate 100 may be thinned by chemical mechanical polishing or other suitable processes. Next, as shown in FIG. 1I, a cavity 110 and a plurality of gate structures 120 are formed on the substrate 100', wherein the cavity 110 penetrates through the substrate 100', and the plurality of gate structures 120 extend from an inner wall 111 of the cavity 110 to the center of the cavity 110. In an embodiment, the ends, extending towards the center, of the plurality of gate structures 120 are, for example, correspondingly distributed on the periphery of the main deformation zone 300a of the diaphragm 300, and the plurality of gate structures 120 respectively correspond to the plurality of support structures 840. Thus, the support structures 840 are stably supported by the gate structures 120 to make the overall mechanical structure more stable.

Specifically, the cavity 110 is formed in the substrate 100' by deep reactive ion etching or other suitable processes, and the cavity 110 penetrates through the substrate 100' in a vertical direction, wherein when a back surface 101' of the substrate 100' is patterned, a height difference may be formed by different mask combinations to form the gate structures 120 at the bottom of the cavity 110. In an embodiment, a zone of the cavity 110 outside the gate structures 120 penetrates through the substrate 100'. For the gate structures 120 not penetrating through the substrate 100', a longest distance from a front surface 102 of the substrate 100' is not more than 5 um, and the thickness of the gate structures 120 is any thickness definable for the substrate 100', which is not limited here.

Figure 3A:
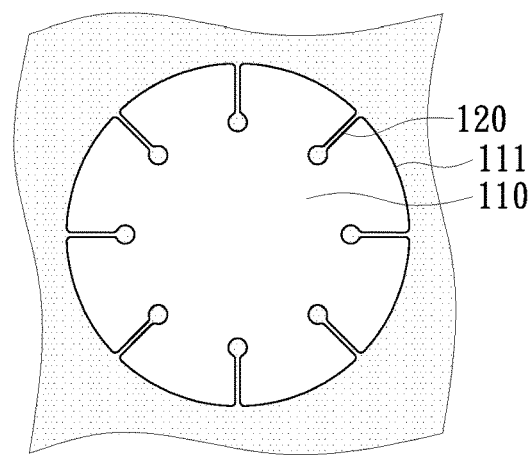
FIG. 3A to FIG. 3C are respectively schematic top views of a cavity and silicon gate structures according to an embodiment of the present invention.
Figure 3B:
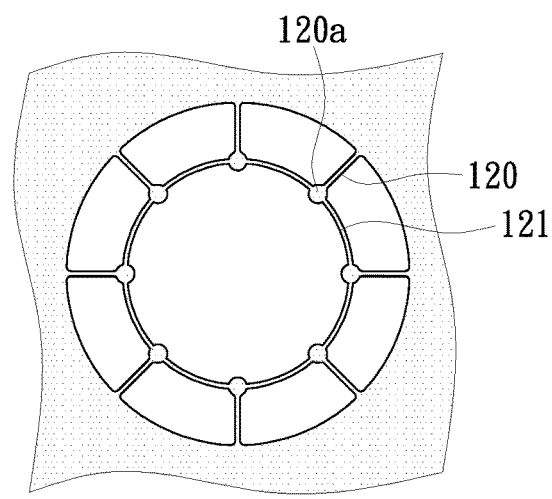
Figure 3C:
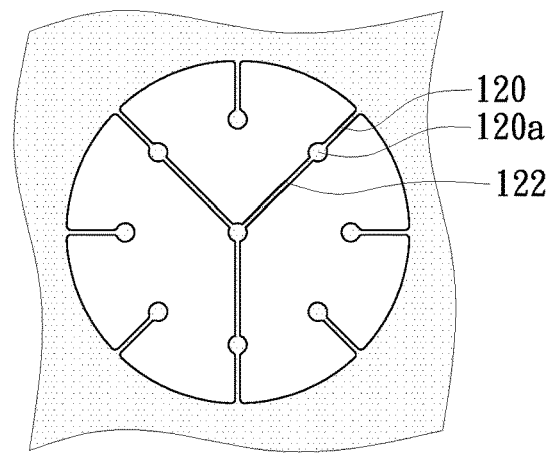

Referring to FIG. 3A to 3C which are respectively schematic top views of a cavity and silicon gate structures according to an embodiment of the present invention at the same time. As shown in FIG. 3A, the plurality of gate structures 120 extend from the inner wall 111 of the cavity 110 to the center of the cavity 110 in a centric shape. As shown in FIG. 3B, the ends 120a, extending towards the center, of the plurality of gate structures 120 may be connected together by a ring structure 121. As shown in FIG. 3C, the ends 120a of a part of the gate structures 120 are mutually connected by bracket structures 122. In an embodiment, the gate structures 120 may be formed by a combination of shapes such as a strip, a circle, a ring, an ellipse, a polygon or any shape.

Figure 1J:
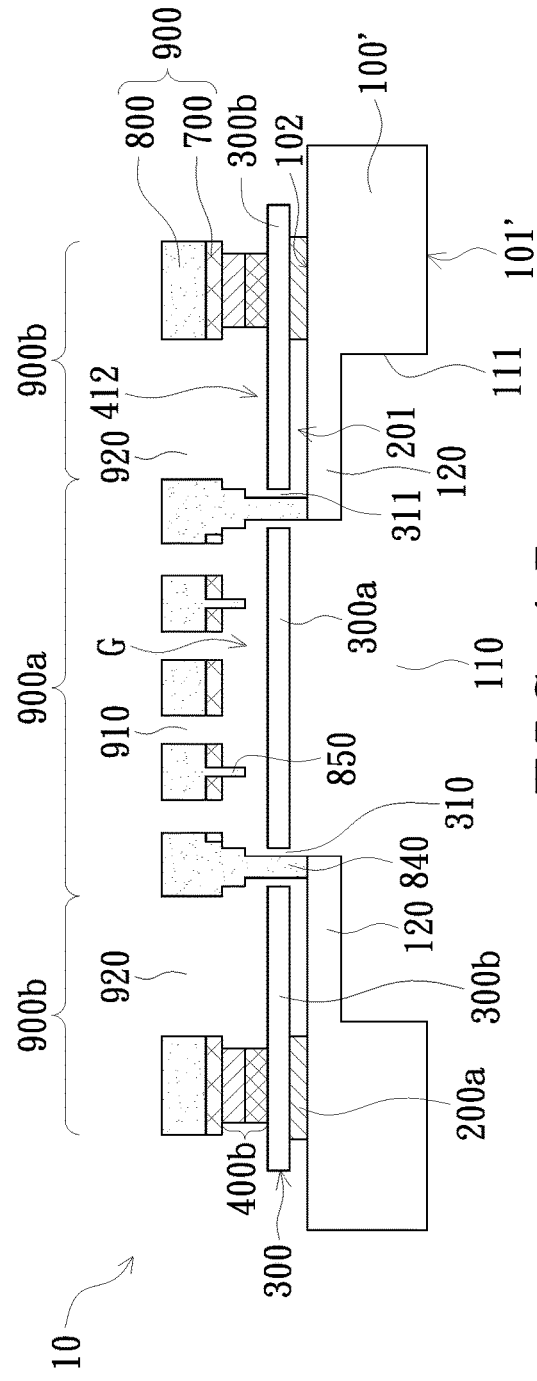

After that, as shown in FIG. 1J, a part of the first sacrificial layer 200 (marked in FIG. 1I, a part of the second sacrificial layer 400 (marked in FIG. 1I) and a part of the third sacrificial layer 410 (marked in FIG. 1I) are removed, wherein a first opening 201 is formed in the first sacrificial layer 200 to connect with the cavity 110, and a second opening 412 is formed in the second sacrificial layer 400 and the third sacrificial layer 410 to connect with the first sound holes 910 and the second sound holes 920. In an embodiment, when a part of the second sacrificial layer 400 is removed, a part of the second sacrificial layer 400a (marked in FIG. 1I) remained in the inner walls of the diaphragm through holes 310 is removed, so that gap 311 exist between the support structures 840 and the inner walls of the diaphragm through holes 310. In an embodiment, when a part of the first sacrificial layer 200 is removed to form the first opening 201, a part of the first sacrificial layer 200 is reserved between the non-main deformation zone 300b of the diaphragm 300 and the substrate 100 to serve as a first insulating spacer layer 200a; and when a part of the second sacrificial layer 400 and a part of the third sacrificial layer 410 are removed to form the second opening 412, a part of the second sacrificial layer 400 and a part of the third sacrificial layer 410 are reserved between the non-main deformation zone 300b of the diaphragm 300 and the non-main electrode zone 900b of the back plate structure 900 to serve as a second insulating spacer layer 400b. Through the formation of the second opening 412, the vibrating electrode (the diaphragm 300) faces the back-plate electrode 700, and an air gap G exists between the vibrating electrode (the diaphragm 300) and the back-plate electrode 700. The position where the air gap G is located may act as a structural operation zone of the MEMS capacitance microphone 10.

As shown in FIG. 1J which is a schematic cross-sectional view of a MEMS capacitance microphone according to an embodiment of the present invention, the MEMS capacitance microphone 10 mainly includes the substrate 100', the diaphragm 300, the back plate structure 900 and the plurality of support structures 840. The substrate 100 is provided with the cavity 110 and the plurality of gate structures 120, the cavity 110 penetrates through the substrate 100', and the plurality of gate structures 120 extend from the inner wall 111 of the cavity 110 to the center of the cavity 110. The diaphragm 300 is vibratably arranged on one side of the substrate 100', and the diaphragm 300 includes a main deformation zone 300a and a non-main deformation zone 300b, and the non-main deformation zone 300b surrounds the main deformation zone 300a. The back plate structure 900 is arranged on one side of the diaphragm 300, and the diaphragm 300 is located between the substrate 100 and the back plate structure 900. The plurality of support structures 840 are arranged on the back plate structure 900, penetrate the periphery of the main deformation zone 300a of the diaphragm 300, and respectively abut against the plurality of gate structures 120.

The back plate structure 900 includes a back-plate main body 800 and a back-plate electrode 700, the diaphragm 300 as the vibrating electrode faces the back-plate electrode 700, and the air gap G exists between the diaphragm 300 and the back-plate electrode 700. The plurality of first sound holes 910 are formed in the main electrode zone 900a of the back plate structure 900, and the plurality of second sound holes 920 are formed in the non-main electrode zone 900b of the back plate structure 900, wherein the area of each of the second sound holes 920 is larger than the area of each of the first sound holes 910.

In addition, the first insulating spacer layer 200a is arranged between the non-main deformation zone 300b of the diaphragm 300 and the substrate 100, the first insulating spacer layer 200a is formed with the first opening 201 to connect with the cavity 110, the second insulating spacer layer 400b is arranged between the non-main deformation zone 300b of the diaphragm 300 and the non-main electrode zone 900b of the back plate structure 900, and the second insulating spacer layer 400b is formed with the second opening 412 to connect with the first sound holes 910 and the second sound holes 920. The anti-adhesion stoppers 850 connected with the back-plate main body 800 are arranged on the back-plate electrode 700 and protrude to the air gap G towards the diaphragm 300.

In a structure of the MEMS capacitance microphone according to the embodiment of the present invention, due to the arrangement of the gate structures, the support structures can be provided between the back plate structure and the gate structures to support an inner side zone of the back plate structure, prevent excessive deformation and provide the back plate structure with higher rigidity. Because the inner side zone of the back plate structure is supported, a large area of acoustic holes (i.e., a larger area of second sound holes) can be formed in the periphery of the supported position to greatly reduce the impedance of air so as to increase the signal-to-noise ratio of the MEMS capacitance microphone. Therefore, an improvement is proposed for the MEMS capacitance microphone according to the embodiment of the present invention in terms of the problem that the rigidity of the back plate is increased to reduce the amount of deformation to affect the acoustic output or the problem of structural collapse due to insufficient rigidity of the back plate. Meanwhile, without reducing the effective electrode of the back plate, the opening ratio of the back plate can be greatly increased to reduce the air squeeze film damping of the air gap and the air viscous damping of the acoustic holes of the back plate so as to increase the signal-to-noise ratio of the MEMS capacitance microphone.

Besides, in the structure of the MEMS capacitance microphone according to the embodiment of the present invention, the diaphragm can be divided into the main deformation zone and the non-main deformation zone according to the degree of change of its deformation curve, that is, the non-main deformation zone of the diaphragm corresponds to the non-main electrode zone of the back plate structure, and the main deformation zone of the diaphragm corresponds to the main electrode zone of the back plate structure. The back-plate electrode in the non-main electrode zone is less helpful for the sensing efficiency of the MEMS capacitance microphone, so that a large ratio of the acoustic holes (i.e., a larger area of the second sound holes) can be formed in the non-main electrode zone to reduce the impedance of air so as to increase the signal-to-noise ratio. In addition, the back-plate electrode is mainly arranged in the main electrode zone corresponding to the main deformation zone, so that the optimum capacitance change ratio can be obtained according to the deformation zone of the diaphragm for the sensitivity of the MEMS capacitance microphone, and the sensing efficiency of the MEMS capacitance microphone can be improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A MEMS capacitance microphone, comprising:
a substrate provided with a cavity and a plurality of gate structures, the cavity penetrating through the substrate, the plurality of gate structures extending from an inner wall of the cavity to the center of the cavity in a centric shape;

a diaphragm vibratably arranged on one side of the substrate and including a main deformation zone and a non-main deformation zone surrounding the main deformation zone;

a back plate structure arranged on one side of the diaphragm and the diaphragm located between the substrate and the back plate structure; and a plurality of support structures arranged on the back plate structure, penetrating the periphery of the main deformation zone of the diaphragm, and respectively abutting against the plurality of gate structures, wherein the ends, extending towards the center, of the plurality of gate structures are correspondingly distributed on the periphery of the main deformation zone of the diaphragm, and the plurality of gate structures respectively correspond to the plurality of support structures, so that the plurality of support structures are stably supported by the plurality of gate structures.

2. The MEMS capacitance microphone according to claim 1, wherein the back plate structure comprises a back-plate main body and a back-plate electrode, the diaphragm is used as a vibrating electrode, the vibrating electrode faces the back-plate electrode, and an air gap exists between the vibrating electrode and the back-plate electrode.

3. The MEMS capacitance microphone according to claim 2, wherein the back plate structure further comprises a plurality of anti-adhesion stoppers arranged on the back-plate electrode and protruding towards the vibrating electrode.

4. The MEMS capacitance microphone according to claim 2, wherein the back plate structure defines a first zone and a second zone, the first zone corresponds to the main deformation zone of the diaphragm, the second zone corresponds to the non-main deformation zone of the diaphragm, the first zone is formed with a plurality of first sound holes, the second zone is formed with a plurality of second sound holes, and the area of each of the plurality of second sound holes is larger than the area of each of the plurality of first sound holes.

5. The MEMS capacitance microphone according to claim 4, wherein an opening ratio of the plurality of second sound holes in the second zone is greater than 60%, and the shape of the plurality of second sound holes is selected from one or a combination of a circle, an ellipse or a polygon.

6. The MEMS capacitance microphone according to claim 4, further comprising a first insulating spacer layer and a second insulating spacer layer, wherein the first insulating spacer layer and the second insulating spacer layer are respectively provided with a first opening and a second opening, the first insulating spacer layer is arranged between the non-main deformation zone of the diaphragm and the substrate, the first opening connects with the cavity, the second insulating spacer layer is arranged between the non-main deformation zone of the diaphragm and the second zone of the back plate structure, and the second opening connects with the plurality of first sound holes and the plurality of second sound holes.

7. The MEMS capacitance microphone according to claim 1, wherein the plurality of gate structures are evenly distributed on the inner wall of the cavity.

8. The MEMS capacitance microphone according to claim 1, wherein the shape of the plurality of gate structures is selected from one or a combination of a strip, a circle, a ring, an ellipse, a honeycomb, a square, a triangle and a polygon.

9. The MEMS capacitance microphone according to claim 1, wherein the diaphragm is formed with a plurality of diaphragm through holes for the plurality of support structures to respectively pass through.

* * * * *